United States Patent
Xiao et al.

(10) Patent No.: US 12,439,553 B2
(45) Date of Patent: Oct. 7, 2025

(54) WATER COOLING DEVICE

(71) Applicant: SHENZHEN APALTEK CO., LTD., Shenzhen (CN)

(72) Inventors: Qineng Xiao, Guangdong (CN); Dagao Zheng, Shenzhen (CN); Minrui Chen, Shenzhen (CN)

(73) Assignee: SHENZHEN APALTEK CO., LTD., Shenzhen (CN)

( * ) Notice: Subject to any disclaimer, the term of this patent is extended or adjusted under 35 U.S.C. 154(b) by 271 days.

(21) Appl. No.: 18/134,556

(22) Filed: Apr. 13, 2023

(65) Prior Publication Data
US 2024/0015927 A1    Jan. 11, 2024

(30) Foreign Application Priority Data
Jul. 5, 2022   (CN) .......................... 202221714791.0

(51) Int. Cl.
*F28F 9/00* (2006.01)
*F28F 1/12* (2006.01)
*H05K 7/20* (2006.01)

(52) U.S. Cl.
CPC ......... *H05K 7/20272* (2013.01); *F28F 1/126* (2013.01); *H05K 7/20263* (2013.01); *F28F 2220/00* (2013.01); *F28F 2250/08* (2013.01)

(58) Field of Classification Search
CPC .. H05K 7/20; H05K 7/20272; H05K 7/20263; F28F 1/12; F28F 1/126; F28F 2250/08; F28F 2220/00; F28D 1/05375; F28D 2021/0031
See application file for complete search history.

(56) References Cited

U.S. PATENT DOCUMENTS

| | | | |
|---|---|---|---|
| 3,349,755 A * | 10/1967 | Miller | F24D 3/02 122/406.1 |
| 2006/0073023 A1* | 4/2006 | Ghoshal | H02K 44/06 417/48 |
| 2007/0204983 A1* | 9/2007 | Ichiyanagi | F25B 9/008 165/173 |
| 2021/0247100 A1* | 8/2021 | Ohigashi | F28D 7/0075 |

* cited by examiner

*Primary Examiner* — Harry E Arant
(74) *Attorney, Agent, or Firm* — HDLS IPR SERVICES; Chun-Ming Shih (57) ABSTRACT

A water-cooling device includes a water input/output module, a pump module, and multiple tubes. The water input/output module includes a first box, a water input connector, and a water output connector. The first box is divided into a water input chamber and a water output chamber by a separator plate. The water input connector communicates with the water input chamber. The water output connector communicates with the water output chamber. A lateral side of each of the water input chamber and the water output chamber is disposed with first openings. The pump module is arranged with the water input/output module at an interval. The pump module includes a second box and pumps in the second box. A lateral side of the second box is disposed with second openings. Two ends of each tube are separately connected to the first opening and the second opening.

6 Claims, 10 Drawing Sheets

WATER COOLING DEVICE

BACKGROUND

Technical Field

The disclosure relates to a cooling device, particularly to a water-cooling device.

Related Art

With continuous improvement of the operating speed of elements in electronic products such as processors, the heat generated therefrom becomes higher and higher. This causes that general air-cooling devices cannot reach the current requirements of cooling. Only water-cooling devices using working fluid such as water to implement circular cooling can effectively cool the abovementioned electronic heating elements.

Although a water-cooling device solves the problem of the aforementioned air-cooling device, it still has the following problems. Due to the large volume and complex structure of a water-cooling device, its scope and field of use are limited. Although related solutions have been proposed by the industry, there are still related problems such as short service life to be improved.

In view of this, the inventors have devoted themselves to the above-mentioned related art, researched intensively and cooperated with the application of science to try to solve the above-mentioned problems. Finally, the invention which is reasonable and effective to overcome the above drawbacks is provided.

SUMMARY

An object of the disclosure is to provide a water-cooling device, which is easily assembled with respect to simple structure and the service life of the cooling device may be extended.

To accomplish the above object, the disclosure provides a water-cooling device, which includes a water input/output module, a pump module, and multiple tubes. The water input/output module includes a first box, a water input connector, and a water output connector. The first box is divided into a water input chamber and a water output chamber by a separator plate disposed therein. The water input connector communicates with the water input chamber. The water output connector communicates with the water output chamber. A lateral side of each of the water input chamber and the water output chamber is disposed with multiple first openings. The pump module is arranged with the water input/output module at an interval. The pump module includes a second box, a first pump and a second pump. The second box has a water entry room, a water delivery room and a water drain room defined therein. The first pump is arranged between the water entry room and the water delivery room. The second pump is arranged between the water delivery room and the water drain room. The water entry room is disposed with a water entry hole communicating with the first pump. The water delivery room is disposed with a first water delivery hole communicating with the first pump and disposed with a second water delivery hole communicating with the second pump. The water drain room is disposed with a water drain hole communicating with the second pump. A lateral side of the second box is disposed with multiple second openings. Two ends of each tube are separately connected to one of the first openings and one of the second openings.

The disclosure further has the following functions. By the pumps being connected in series and formed over each tube, it may be applied to products with high flow head and the service life of the whole device may be extended, and further the cooling area may be increased to improve the cooling performance. By the upright arrangement of the water input/output module and the pump module, the water storage capacity may be increased. By the fan assembly arranged between the water input/output module and the pump module, the whole appearance may be more aesthetic and integrated.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Please refer to FIGS. 1-4. The disclosure provides a water-cooling device, which includes a water input/output module 10, a pump module 20 and multiple tubes 30.

The water input/output module 10 includes a first box 11, a water input connector 12 and a water output connector 13. The first box 11 is substantially of a rectangular shape. A separator plate 111 is disposed in the first box 11 to divide the inside of the first box 11 into a water input chamber 112 and a water output chamber 113. The water output chamber 113 does not communicate with the water input chamber 112. The water input connector 12 communicates with the water input chamber 112. The water output connector 13 communicates with the water output chamber 113. A lateral side of each of the water input chamber 112 and the water output chamber 113 is disposed with multiple first openings 114.

Figure 3:
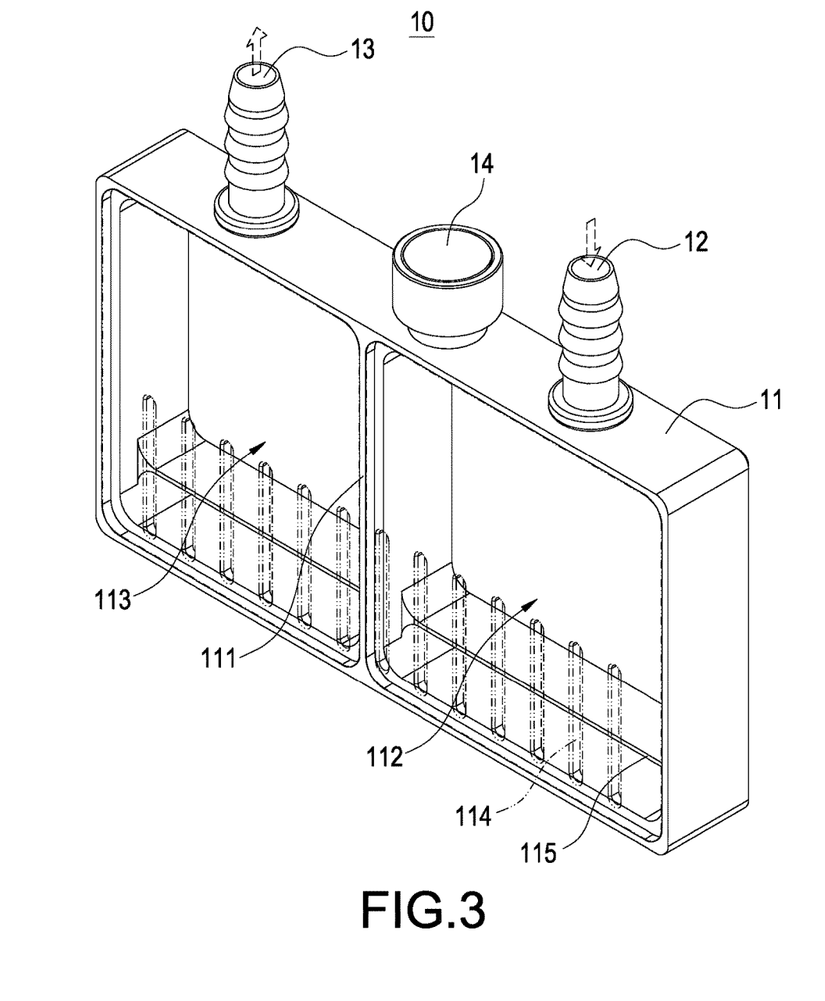
FIG. 3 is a schematic view of the water input/output module of the disclosure.

In an embodiment, the first box 11 is disposed with a water filling connector 14. The water filling connector 14 is arranged to be adjacent to the water input connector 12 and communicates with the water input chamber 112 for water supply.

Figure 1:
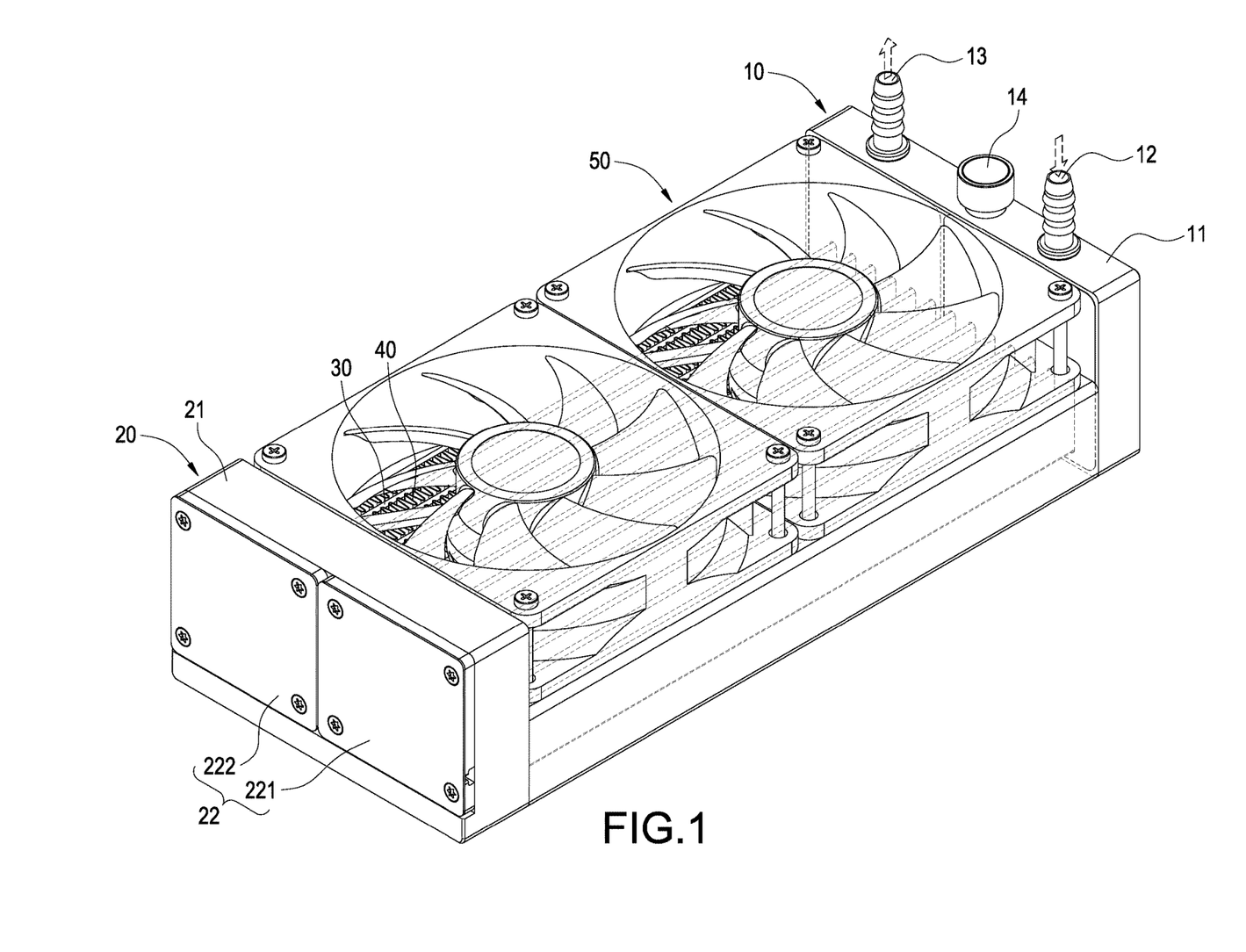
FIG. 1 is a perspective view of the water-cooling device of the disclosure.
Figure 2:
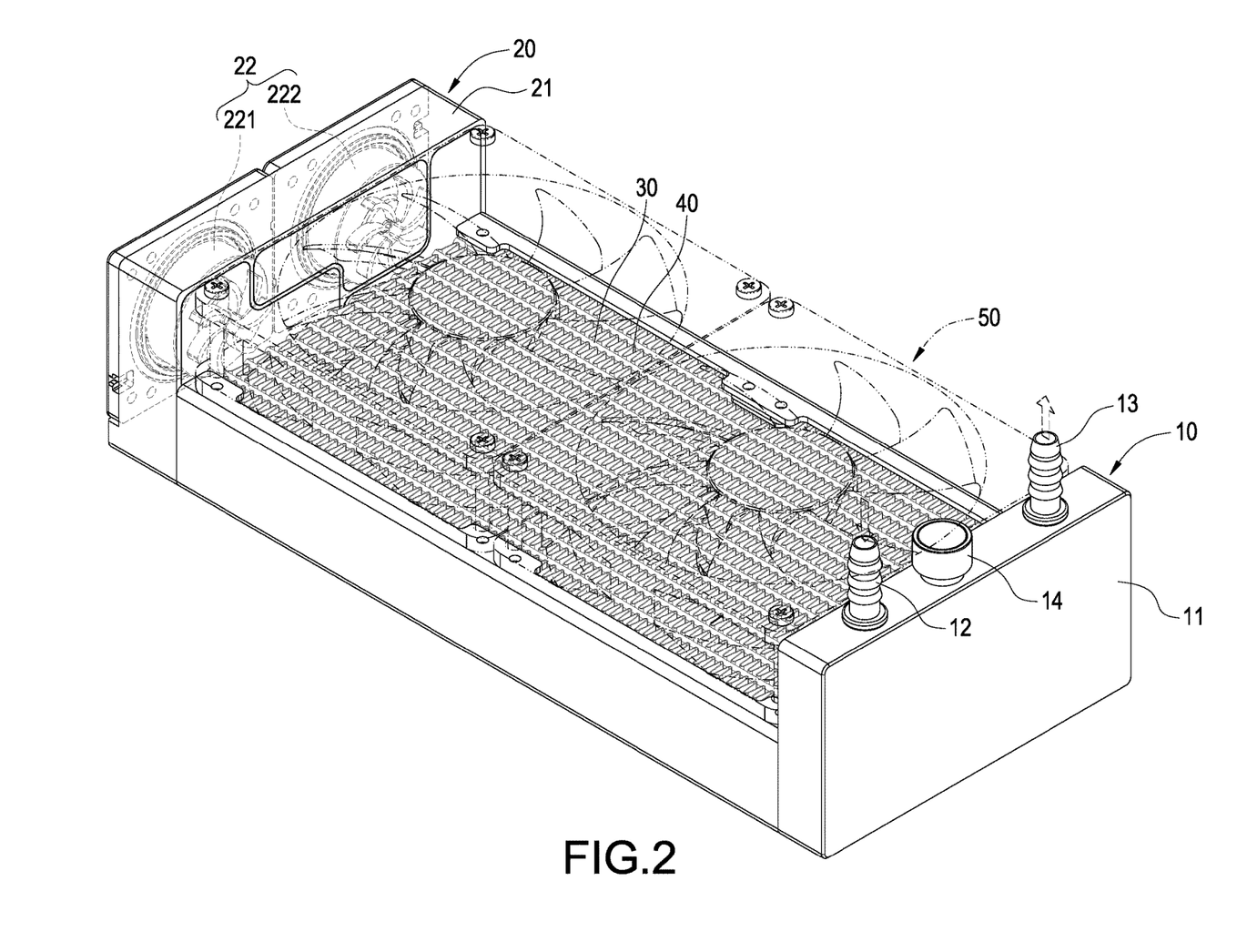
FIG. 2 is a see-through view of the water-cooling device of the disclosure.
Figure 4:
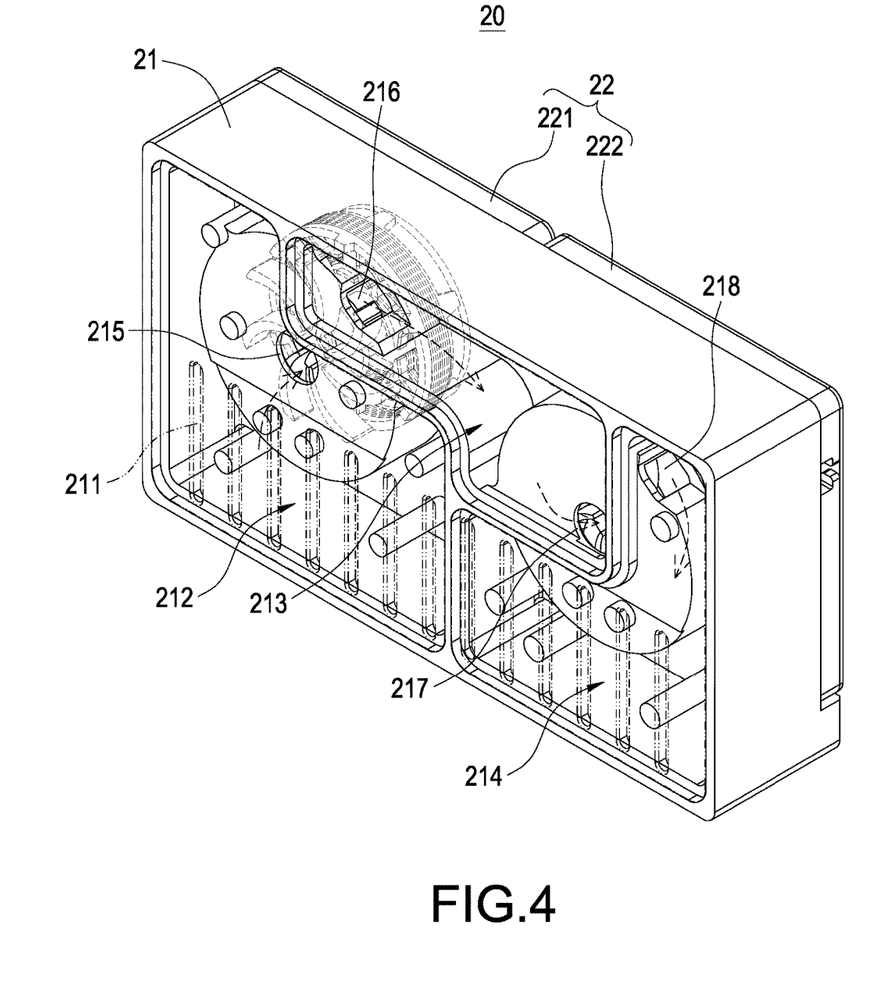
FIG. 4 is a schematic view of the pump module of the disclosure.
Figure 5:
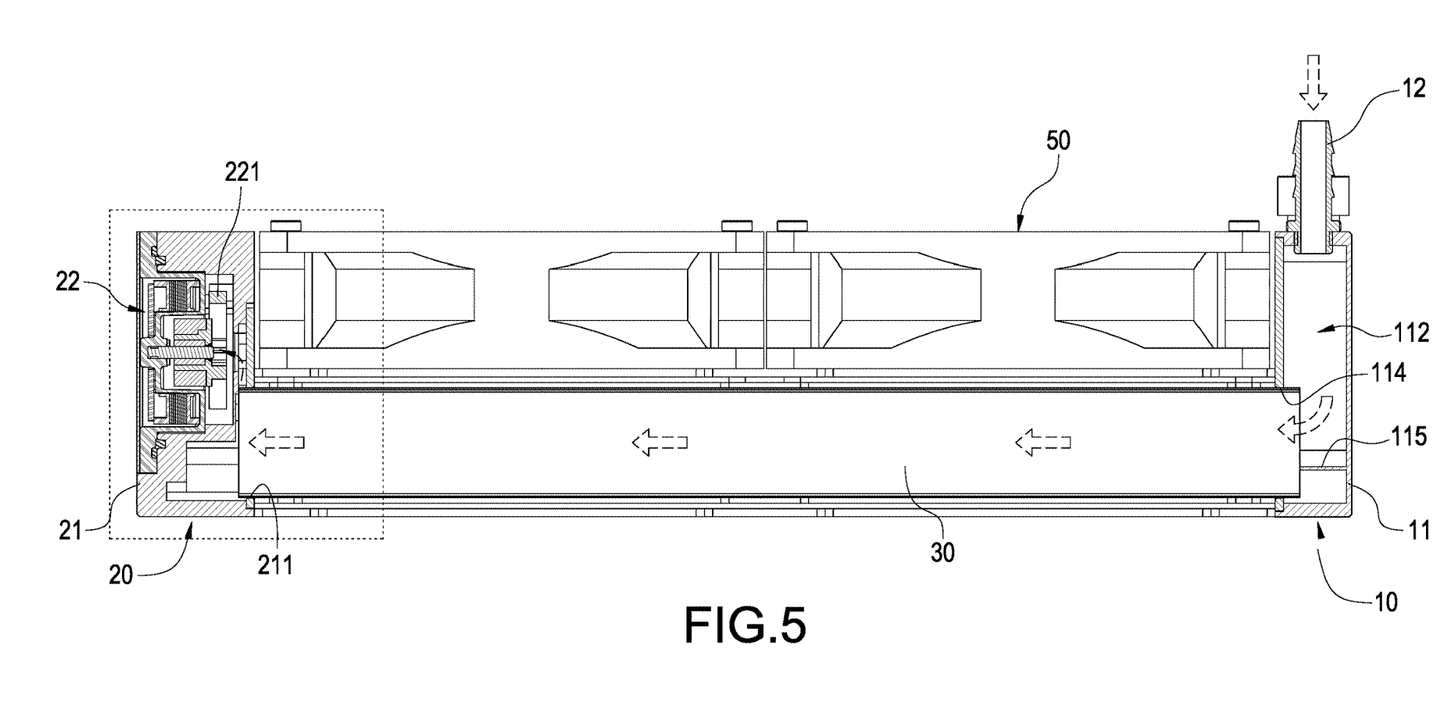
FIG. 5 is a cross-sectional view of the water-cooling device of the disclosure in use.
Figure 6:
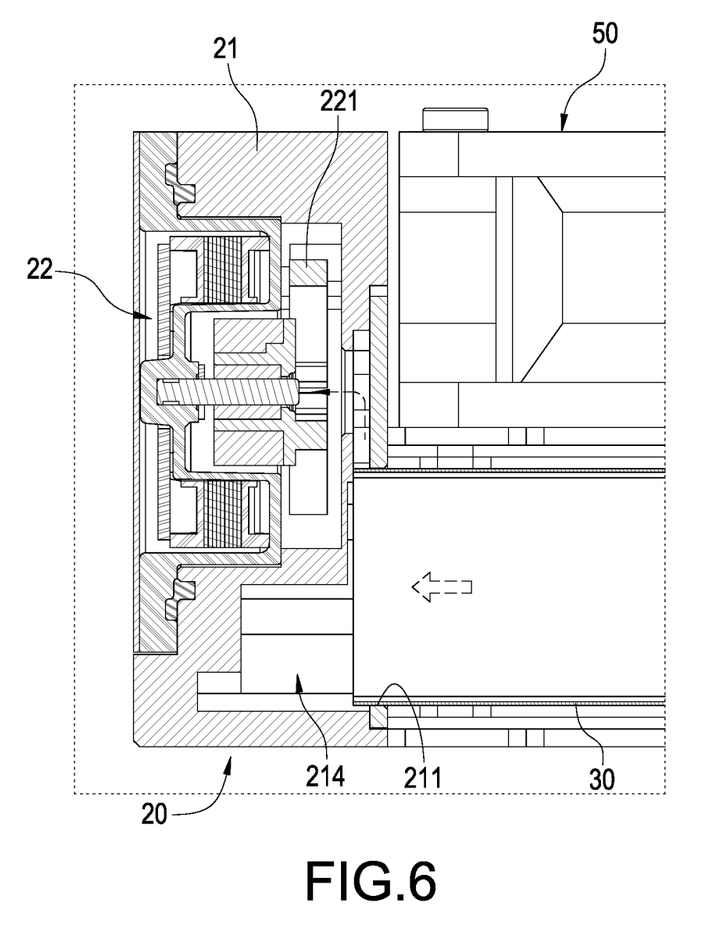
FIG. 6 is a partially enlarged view of FIG. 5.
Figure 7:
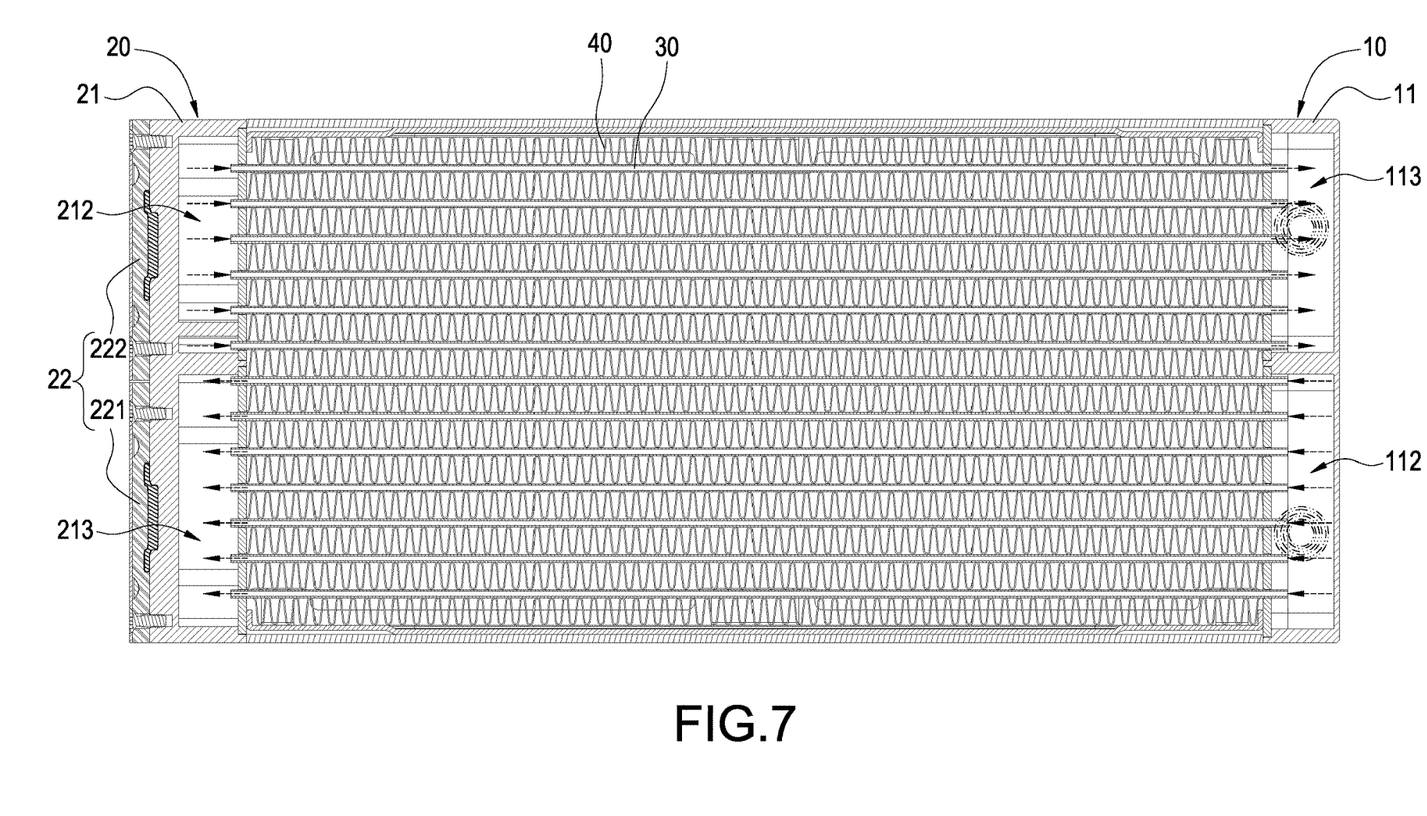
FIG. 7 is a cross-sectional view of the water-cooling device of the disclosure in use.
Figure 8:
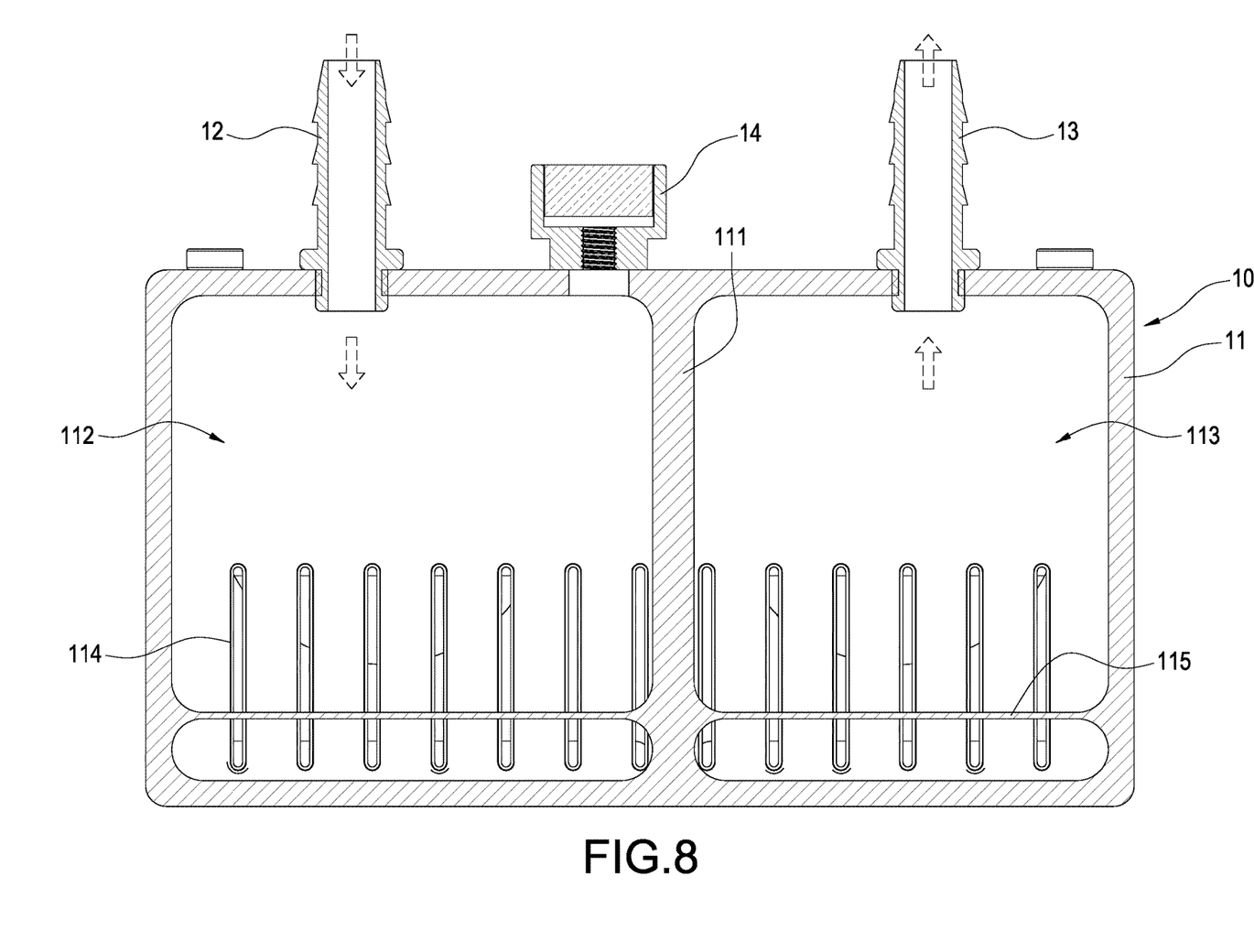
FIG. 8 is a cross-sectional view of the water-cooling device of the disclosure in use.
Figure 9:
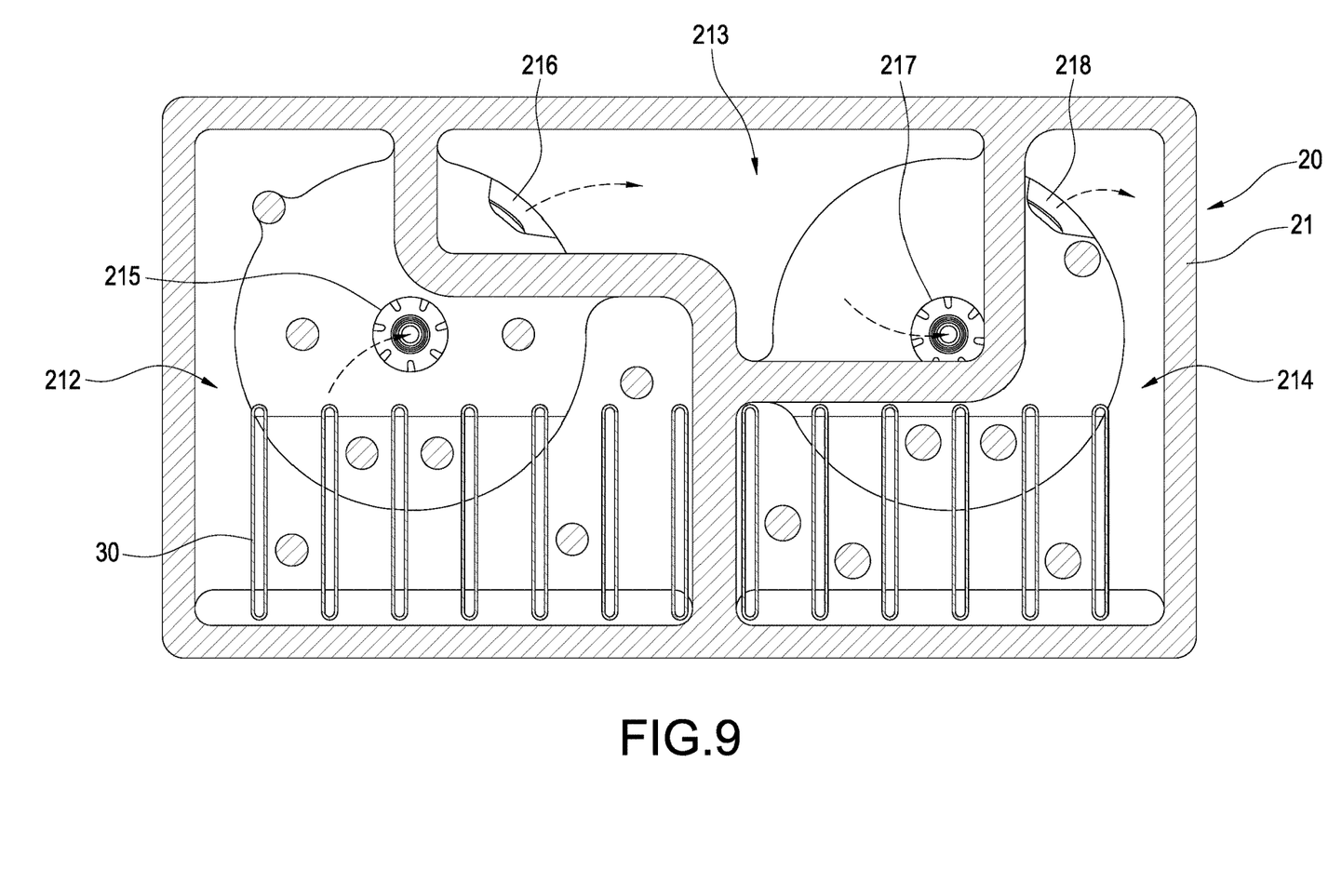
FIG. 9 is a cross-sectional view of the water-cooling device of the disclosure in use.
Figure 10:
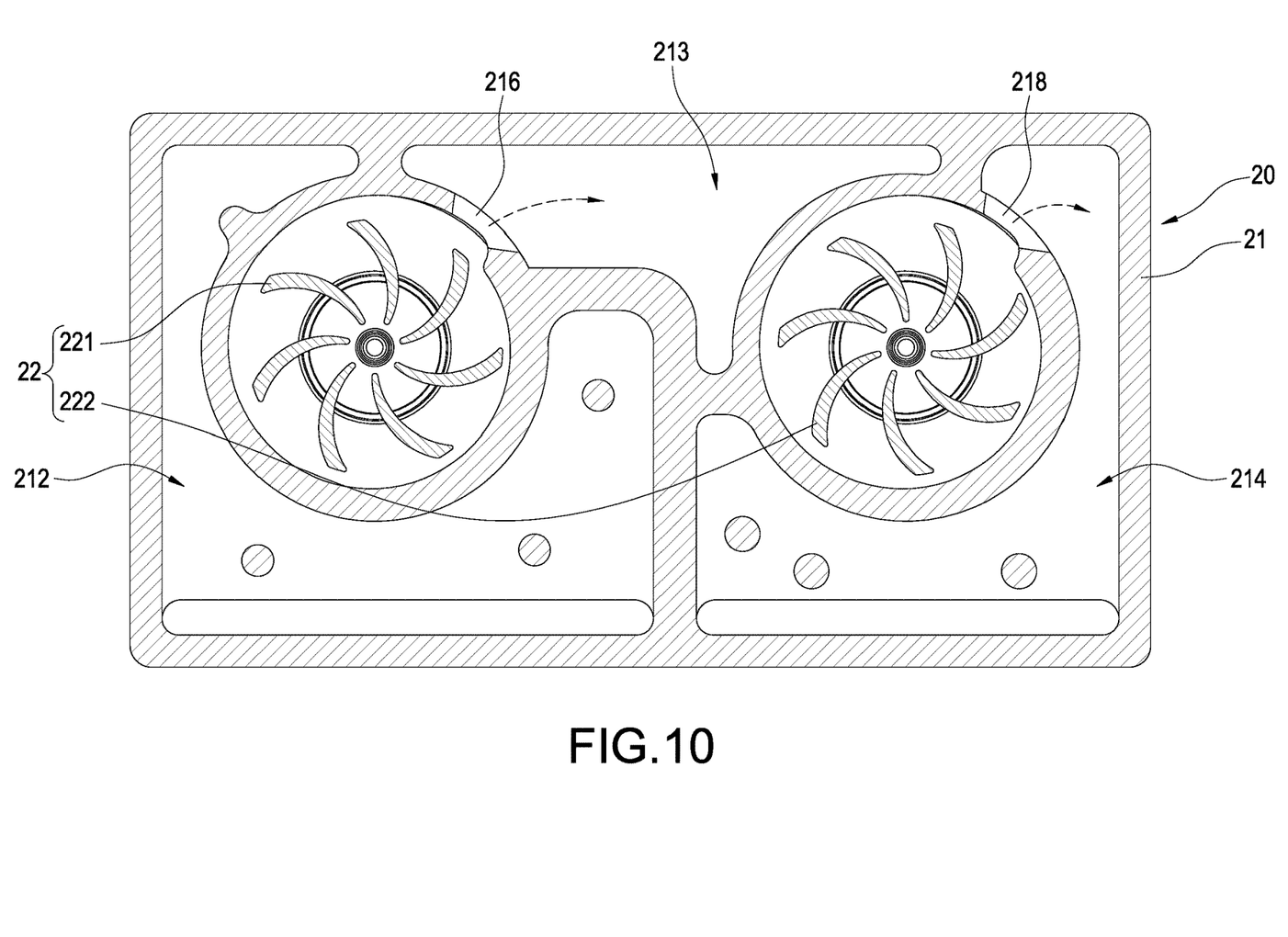
FIG. 10 is a cross-sectional view of the water-cooling device of the disclosure in use.

The pump module 20 is arranged with the water input/output module 10 at an interval and corresponding to each other. The pump module 20 includes a second box 21 and at least one pump 22 disposed in the second box 21. The shape of the second box 21 is substantially the same as or similar to the shape of the first box 11. A lateral side of the second box 21, which faces the first box 11, is disposed with multiple second openings 211. Each second opening 211 is arranged corresponding to each first opening 114.

In an embodiment, the pump 22 includes a first pump 221 and a second pump 222. The first pump 221 and the second pump 222 are arranged parallelly and separately formed over the second openings 211. The inside of the second box 21 has a water entry room 212, a water delivery room 213 and a water drain room 214. The water entry room 212 communicates with one part of the second openings 211, and the water drain room 214 communicates with the other part of the second openings 211. The first pump 221 is arranged between the water entry room 212 and the water delivery room 213. The second pump 222 is arranged between the water delivery room 213 and the water drain room 214. The water entry room 212 is disposed with a water entry hole 215 communicating with the first pump 221. The water delivery room 213 is disposed with a first water delivery hole 216 communicating with the first pump 221 and disposed with a second water delivery hole 217 communicating with the second pump 222. The water drain room 214 is disposed with a water drain hole 218 communicating with the second pump 222.

Each tube 30 is substantially of a flat shape. Two ends of each tube 30 are separately connected to one of the first openings 114 and one of the second openings 211. The first pump 221 and the second pump 22 are upright disposed at one end of each tube 30. That is, the axis lines of the first pump 221 and the second pump 22 are parallel to the center line of each tube 30.

In an embodiment, the inside of each of the water input chamber 112 and the water output chamber 113 is separately disposed with a blocking plate 115. After one end of each tube 30 is inserted into the first opening 114, the end is blocked by each blocking plate 115.

In an embodiment, the water-cooling device of the disclosure further includes multiple cooling fins (or heat dissipating plates) 40. Each cooling fin 40 is of a waved shape. Each cooling fin 40 is located between adjacent two of the tubes 30 and thermally contacts each tube 30.

In an embodiment, the water-cooling device of the disclosure further includes a fan assembly 50, which is assembled by two fan units. The fan assembly 50 is disposed over each tube 30 and each cooling fin 40 and located between the water input/output module 10 and the pump module 20 to provide a forced air flow to dissipate heat.

Please refer to FIGS. 5-10. When using, working fluid such as water enters from the water input connector 12, and then flows through the water input chamber 112, the insides of part of the tubes 30 and the water entry room 212 in order, the water is drawn in the first pump 221 by the impeller of the first pump 221 from the water entry hole 215, and the water is drawn out of the first water delivery hole 216 to enter the water delivery room 213 by the impeller of the first pump 221. Next, the water is drawn in the second pump 222 from the second water delivery hole 217 by the impeller of the second pump 222, and the water is drawn out of the water drain hole 218 to enter the water drain room 214 by the impeller of the second pump 222. Then, the water flows through the insides of the other part of the tubes 30 to reach the water output chamber 113, and is finally ejected via the water output connector 13. When the water flows through the inside of each tube 30, a forced air flow generated by the fan assembly 50 and the thermal conduction of each cooling fin 40 and each tube 30 may cool each cooling fin 40 and each tube 30 to improve the overall cooling performance.

While this disclosure has been described by means of specific embodiments, numerous modifications and variations could be made thereto by those skilled in the art without departing from the scope and spirit of this disclosure set forth in the claims.

What is claimed is:

1. A water cooling device, comprising:
a water input/output module, comprising a first box, a water input connector and a water output connector, the first box divided to a water input chamber and a water output chamber by a separator plate disposed therein, the water input connector communicating with the water input chamber, the water output connector communicating with the water output chamber, and multiple first openings respectively defined on a lateral side of the water input chamber and a lateral side of the water output chamber;
a pump module, arranged spacedly with the water input/output module, comprising a second box, a first pump and a second pump, the second box comprising a water entry room, a first pump accommodating room, a water delivery room, a second pump accommodating room and a water drain room defined by walls divided therein, the first pump disposed in the first pump accommodating room, and arranged between the water entry room and the water delivery room, the second pump disposed in the second pump accommodating room, and arranged between the water delivery room and the water drain room, a water entry hole defined on a first wall formed between the water entry room and the first pump accommodating room, a first water delivery hole defined on a second wall formed between the first pump accommodating room and the water delivery room, a second water delivery hole defined on a third wall formed between the water delivery room and the second pump accommodating room, a water drain hole defined on a fourth wall formed between the second pump accommodating room and the water drain room, and multiple second openings defined on a lateral side of the second box; and
multiple tubes, two ends of each tube separately connected to one of the first openings and one of the second openings;
wherein the first pump and the second pump are upright disposed at one end of each tube;
wherein the first pump and the second pump are arranged parallelly and disposed over the second openings.

2. The water-cooling device of claim 1, wherein the water entry room communicates with a part of the second openings, and the water drain room communicates with another part of the second openings.

3. The water-cooling device of claim 1, wherein the water input/output module further comprises a water filling connector installed in the first box and communicating with the water input chamber.

4. The water-cooling device of claim 1, wherein a blocking plate is respectively disposed in the water input chamber and the water output chamber, and one end of each tube is blocked by the blocking plate after being inserted to the first opening.

5. The water-cooling device of claim 1, further comprising multiple cooling fins, each cooling fin located between adjacent two of the tubes and thermally contacting the tubes.

6. The water-cooling device of claim 5, further comprising a fan assembly disposed over each tube and each cooling fin and located between the water input/output module and the pump module.

\* \* \* \* \*